(12) United States Patent
Badwekar et al.

(10) Patent No.: US 11,300,623 B2
(45) Date of Patent: Apr. 12, 2022

(54) METHOD AND SYSTEM FOR REMAINING USEFUL LIFE PREDICTION OF LITHIUM BASED BATTERIES

(71) Applicant: Tata Consultancy Services Limited, Mumbai (IN)

(72) Inventors: Kaustubh Rajendra Badwekar, Pune (IN); Naga Neehar Dingari, Pune (IN); Mahesh Mynam, Pune (IN); Beena Rai, Pune (IN)

(73) Assignee: Tata Consultancy Services Limited, Mumbai (IN)

( * ) Notice: Subject to any disclaimer, the term of this patent is extended or adjusted under 35 U.S.C. 154(b) by 178 days.

(21) Appl. No.: 15/929,522

(22) Filed: May 7, 2020

(65) Prior Publication Data

US 2020/0355750 A1    Nov. 12, 2020

(30) Foreign Application Priority Data

May 8, 2019  (IN) .............................. 201921018433

(51) Int. Cl.
  *G01R 31/392*   (2019.01)
  *G01R 31/3842*  (2019.01)
  (Continued)

(52) U.S. Cl.
  CPC ......... *G01R 31/392* (2019.01); *G01R 31/367* (2019.01); *G01R 31/3842* (2019.01); *G01R 31/382* (2019.01); *G01R 31/385* (2019.01)

(58) Field of Classification Search
  CPC ................ G01R 31/392; G01R 31/367; G01R 31/3842; G01R 31/382; G01R 31/385
  See application file for complete search history.

(56) References Cited

U.S. PATENT DOCUMENTS

2019/0113577 A1\*  4/2019  Severson ............. G01R 31/392
2021/0063490 A1\*  3/2021  Naha .................... G01R 31/382

FOREIGN PATENT DOCUMENTS

CN         105301509 B    3/2019
CN         106918789 B    5/2019
CN         109738810 A    5/2019

OTHER PUBLICATIONS

Ahmed, R., et al., "Reduced Order Electrochemical Model Parameters Identification and State of Charge Estimation for Healthy and Aged Li-Ion Batteries: Part II Aged Battery Model and State of Charge Estimation", Sep. 2014, IEEE , pp. 678-690. (Year: 2014).\*

(Continued)

*Primary Examiner* — Stacy Whitmore
(74) *Attorney, Agent, or Firm* — Finnegan, Henderson, Farabow, Garrett & Dunner, LLP

(57) ABSTRACT

This disclosure relates generally to relates to the field of estimation of remaining useful life (RUL) in lithium based batteries, and, more particularly, to estimation of remaining useful life in lithium based batteries based on coupled estimation of a state of charge (SOC) and a state of health (SOH) during charging/discharging in constant current (CC) and constant voltage (CV) modes. The disclosed RUL estimation technique considers the inter-dependency of SOC-SOH and influence of internal-external parameters/factors during the coupled estimation of SOC-SOH. The coupled estimation of SOC and SOH is based on a reduced order physics based modelling technique and considers the influence real time environment obtained using real-time dynamic data obtained by several sensors during the coupled estimation of SOC-SOH.

15 Claims, 12 Drawing Sheets

(51) Int. Cl.
    *G01R 31/367*     (2019.01)
    *G01R 31/385*     (2019.01)
    *G01R 31/382*     (2019.01)

(56) References Cited

OTHER PUBLICATIONS

Guha, A., et al., Remaining useful life estimation fo lithium-ion batteries based on internal resistance growth model., Jan. 2017. IEEE. pp. 33-38. (Year: 2017).*

Wang, Y., et al., "Revisiting the state of charge estimation for lithium-ion batteries", Aug. 2017. IEEE, pp. 73-80. (Year: 2017).*

Murnane, M. et al. (2017). "A Closer Look at State of Charge (SOC) and State of Health (SOH) Estimation Techniques for Batteries," retrieved from https://www.analog.com/media/en/technical-documentation/technical-articles/A-Closer-Look-at-State-Of-Charge-and-State-Health-Estimation-Techniques-. . . pdf. (8 pages).

Wang, Z. et al. (Jul. 2018). "Remaining capacity estimation of lithium-ion batteries based on the constant voltage charging profile," PLOS One, pp. 1-22.

* cited by examiner

METHOD AND SYSTEM FOR REMAINING USEFUL LIFE PREDICTION OF LITHIUM BASED BATTERIES

CROSS-REFERENCE TO RELATED APPLICATIONS AND PRIORITY

The present application claims priority from Indian provisional application no. 201921018433, filed on May 8, 2019.

TECHNICAL FIELD

The disclosure herein generally relates to the field of estimation of remaining useful life (RUL) in lithium based batteries, and, more particularly, to estimation of remaining useful life in lithium based batteries based on a coupled estimation of a state of charge (SOC) and a state of health (SOH).

BACKGROUND

Energy storage systems or batteries have received tremendous attention over the last decade, wherein lithium based battery is one of the most sought out key storage systems for technologies in several applications including new electric vehicles. Lithium based batteries are highly in demand due to its high energy density, long cycle life and along with advantages of low self-discharge rate. Considering the high demand for lithium based batteries technology, it is necessary to improve reliability and safety of the lithium based batteries. Hence monitoring the performance of a lithium battery has become an important area of research, wherein one of the key monitoring techniques is by estimation of a Remaining Useful Life (RUL).

Remaining Useful Life (RUL) of lithium based batteries can be estimated/characterized in several ways, of which estimation of state of charge (SOC) and state of health (SOH) are very popular. The existing RUL estimation techniques based on individual estimation of SOC and SOH utilize data analysis techniques or machine learning techniques or equivalent circuit models wherein historical data of lithium battery charging and discharging is utilized, which are not very accurate as do not consider the influence of inter-dependency of SOC and SOH on each other or other internal factors such as Solid-Electrolyte Interphase (SEI) formation nor external factors like operating conditions are considered while estimation of SOC or estimation of SOH. Further the existing physics based electrochemical models are computationally expensive to perform calculations in real time.

SUMMARY

Embodiments of the present disclosure present technological improvements as solutions to one or more of the above-mentioned technical problems recognized by the inventors in conventional systems. For example, in one embodiment, a method for estimation of remaining useful life in lithium based batteries based on coupled estimation of a state of charge (SOC) and a state of health (SOH) during charging/discharging in constant current (CC) and constant voltage (CV) modes is provided.

The system includes a remaining useful life estimator for lithium based batteries for estimation of remaining useful life in lithium based batteries. The remaining useful life estimator for lithium based batteries that includes or is otherwise in communication with a memory, a communication interface, and a processor that may be coupled by a system bus or a similar mechanism. The functions of the components of the system are explained in conjunction with functional modules of the system that comprise a input module that further comprises of a battery parameter unit and a load characteristics unit that is configured for receiving, by one or more hardware processors, a plurality of battery information of a lithium based battery from a plurality of sources. The system further comprises a SOC estimator configured for estimating a basic state of charge (SOC) for the lithium based battery during charging/discharging in constant current (CC) and constant voltage (CV) mode based on a reduced order physics based modelling technique, using the battery parameters and the load characteristics. The system further comprises a SOH estimator configured for estimating a basic state of health (SOH) for the lithium based battery during charging/discharging in constant current (CC) and constant voltage (CV) modes, depending on a solid electrolyte interphase (SEI) formation using the battery parameters and the load characteristics based on a solvent diffusion theory technique. The system further comprises a coupling module configured for iteratively revising the battery parameters based on a SOC-SOH coupled estimation technique, wherein the battery parameters are iteratively revised for each cycle based on iteratively coupling the estimated basic SOC and the estimated basic SOH and for iteratively revising the battery parameters based on the SOC-SOH coupled estimation technique, wherein the battery parameters are iteratively revised for each cycle based on iteratively coupling the estimated revised SOC and the estimated revised SOH. The system further comprises a revised estimator configured for estimating a revised SOC and a revised SOH from the basic SOC and the basic SOH respectively using a correlation technique and a filtering technique based on a dynamic data received from a plurality of battery management system (BMS) sensors, wherein the BMS sensors are configured for sharing the dynamic data that comprises of real time environment data that include a voltage sensor measurement and a current sensor measurement. The system further comprises a RUL estimator for estimating a remaining useful life (RUL) for the lithium based batteries using the revised SOC and the revised SOH. The system further comprises a display module is configured for displaying the estimated remaining useful life (RUL) for the lithium based batteries.

In another aspect, a method for estimation of remaining useful life in lithium based batteries is provided. The method includes receiving, by one or more hardware processors, a plurality of battery information of a lithium based battery from a plurality of sources, wherein the received plurality of battery information includes a plurality of battery parameters and a plurality of load characteristics. The method further includes estimating a basic state of charge (SOC) for the lithium based battery during charging/discharging in constant current (CC) and constant voltage (CV) modes based on a reduced order physics based modelling technique, using the battery parameters and the load characteristics. The method further includes estimating a basic state of health (SOH) for the lithium based battery during charging/discharging in constant current (CC) and constant voltage (CV) modes, depending on a solid electrolyte interphase (SEI) formation using the battery parameters and the load characteristics based on a solvent diffusion theory technique. The method further includes iteratively revising the battery parameters based on a SOC-SOH coupled estimation technique, wherein the battery parameters are iteratively revised for each cycle based on iteratively coupling the estimated basic SOC and the estimated basic SOH. The method further includes estimating a revised SOC and a revised SOH from the basic SOC and the basic SOH respectively using a correlation technique and a filtering technique based on a dynamic data received from a plurality of battery management system (BMS) sensors. The method further includes iteratively revising the battery parameters based on the SOC-SOH coupled estimation technique, wherein the battery parameters are iteratively revised for each cycle based on iteratively coupling the estimated revised SOC and the estimated revised SOH. The method further includes estimating a remaining useful life (RUL) for the lithium based batteries using the revised SOC and the revised SOH.

Another embodiment provides a non-transitory computer-readable medium having embodied thereon a computer program for a computer readable program, wherein the computer readable program, when executed by one or more hardware processors, causes estimation of remaining useful life in lithium based batteries. The program includes receiving, by one or more hardware processors, a plurality of battery information of a lithium based battery from a plurality of sources, wherein the received plurality of battery information includes a plurality of battery parameters and a plurality of load characteristics. The program further includes estimating a basic state of charge (SOC) for the lithium based battery during charging/discharging in constant current (CC) and constant voltage (CV) modes based on a reduced order physics based modelling technique, using the battery parameters and the load characteristics. The program further includes estimating a basic state of health (SOH) for the lithium based battery during charging/discharging in constant current (CC) and constant voltage (CV) modes, depending on a solid electrolyte interphase (SEI) formation using the battery parameters and the load characteristics based on a solvent diffusion theory technique. The program further includes iteratively revising the battery parameters based on a SOC-SOH coupled estimation technique, wherein the battery parameters are iteratively revised for each cycle based on iteratively coupling the estimated basic SOC and the estimated basic SOH. The program further includes estimating a revised SOC and a revised SOH from the basic SOC and the basic SOH respectively using a correlation technique and a filtering technique based on a dynamic data received from a plurality of battery management system (BMS) sensors. The program further includes iteratively revising the battery parameters based on the SOC-SOH coupled estimation technique, wherein the battery parameters are iteratively revised for each cycle based on iteratively coupling the estimated revised SOC and the estimated revised SOH. The program further includes estimating a remaining useful life (RUL) for the lithium based batteries using the revised SOC and the revised SOH.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION OF EMBODIMENTS

Figure 1:
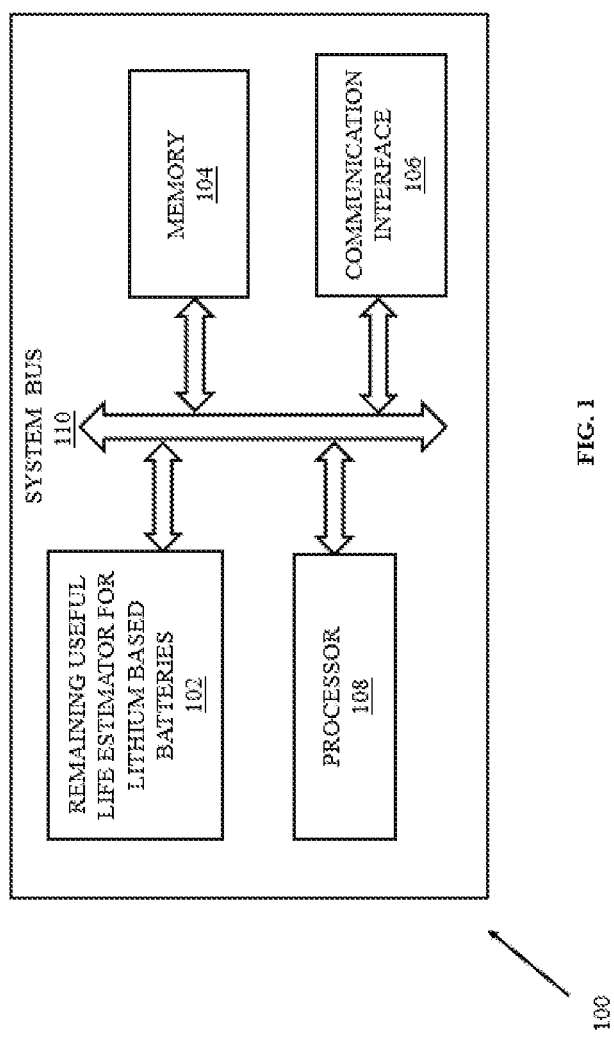
FIG. 1 illustrates an exemplary system for estimation of remaining useful life in lithium based batteries according to some embodiments of the present disclosure.

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the scope of the disclosed embodiments. It is intended that the following detailed description be considered as exemplary only, with the true scope being indicated by the following claims.

Referring now to the drawings, and more particularly to FIG. 1 through FIG. 11, where similar reference characters denote corresponding features consistently throughout the figures, there are shown preferred embodiments and these embodiments are described in the context of the following exemplary system and/or method.

FIG. 1 is a block diagram of a system (100) for estimation of remaining useful life (RUL) of lithium based batteries, in accordance with an example embodiment. The system (100) includes a remaining useful life estimator for lithium based batteries (102) for estimation of remaining useful life in lithium based batteries. The remaining useful life estimator for lithium based batteries (102) includes or is otherwise in communication with a memory (104), a communication interface (106), and a processor (108). The memory (104), the communication interface (106) and the processor (108) may be coupled by a system bus (110) or a similar mechanism. Although FIG. 1 shows example components of remaining useful life estimator for lithium based batteries (102), in other implementations, the system (100) may contain fewer components, additional components, different components, or differently arranged components than depicted in FIG. 1.

The processor (108) may be implemented as one or more microprocessors, microcomputers, microcontrollers, digital signal processors, central processing units, state machines, logic circuitries, and/or any devices that facilitates in designing polymeric carrier for controlled release of molecules. Further, the processor (108) may comprise a multi-core architecture. Among other capabilities, the processor (108) is configured to fetch and execute computer-readable instructions or modules stored in the memory (104). The processor (108) may include circuitry implementing, among others, audio and logic functions associated with the communication. For example, the processor (108) may include, but are not limited to, one or more digital signal processors (DSPs), one or more microprocessor, one or more special-purpose computer chips, one or more field-programmable gate arrays (FPGAs), one or more application-specific integrated circuits (ASICs), one or more computer(s), various analog to digital converters, digital to analog converters, and/or other support circuits. The processor (108) thus may also include the functionality to encode messages and/or data or information. The processor (108) may include, among other things, a clock, an arithmetic logic unit (ALU) and logic gates configured to support operation of the processor (108). Further, the processor (108) may include functionality to execute one or more software programs, which may be stored in the memory (104) or otherwise accessible to the processor (108).

The memory (104), may store any number of pieces of information, and data, used by the system (100) to implement the functions of the system (100). The memory (104) may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. Examples of volatile memory may include but are not limited to volatile random access memory (RAM). The non-volatile memory may additionally or alternatively comprise an electrically erasable programmable read only memory (EEPROM), flash memory, hard drive, or the like. The memory 104 may be configured to store information, data, applications, instructions or the like for enabling the system (100) to carry out various functions in accordance with various example embodiments. Additionally or alternatively, the memory (104) may be configured to store instructions which when executed by the processor (108) causes the system (100) to behave in a manner as described in various embodiments.

The communication interface(s) (106) can facilitate multiple communications within a wide variety of networks and protocol types, including wired networks, for example, local area network (LAN), cable, etc., and wireless networks, such as Wireless LAN (WLAN), cellular, or satellite. For the purpose, the communication interface (s) (106) may include one or more ports. One or more functionalities of the system (100) and components thereof, is further explained in detail with respect to block diagram described in FIG. 2.

Figure 5A:
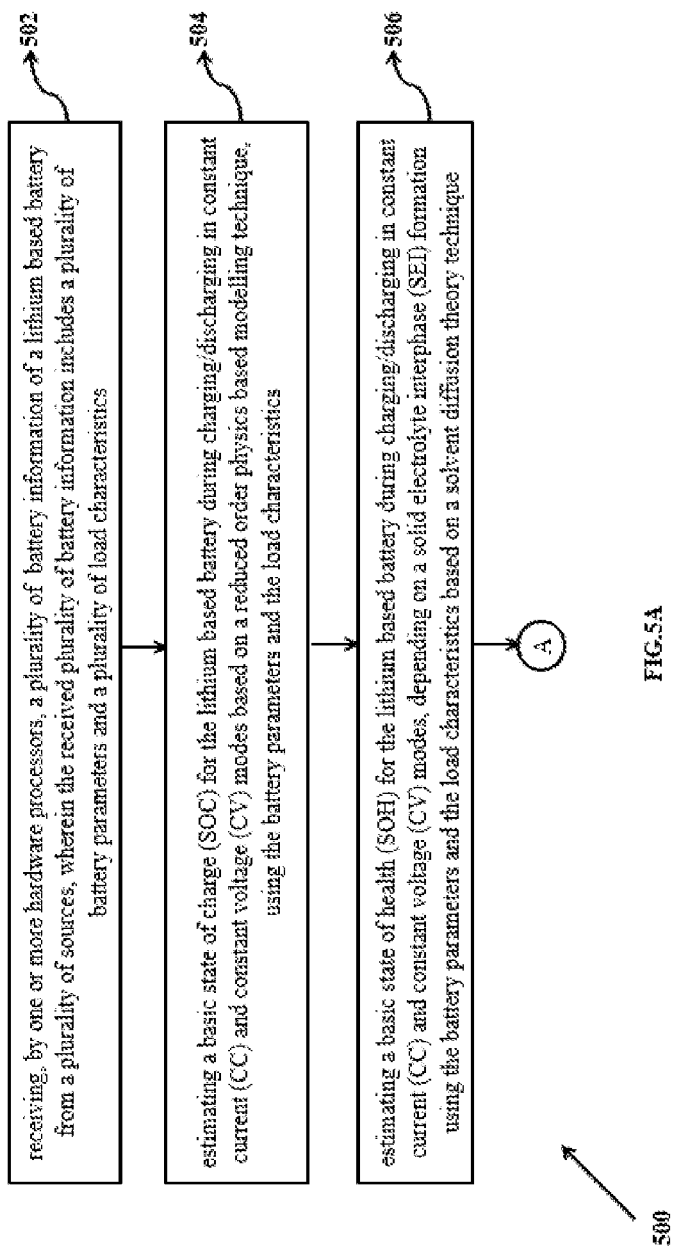
FIG. 5A and FIG. 5B is a flow diagram illustrating a method for estimation of remaining useful life in lithium based batteries in accordance with some embodiments of the present disclosure.
Figure 5B:
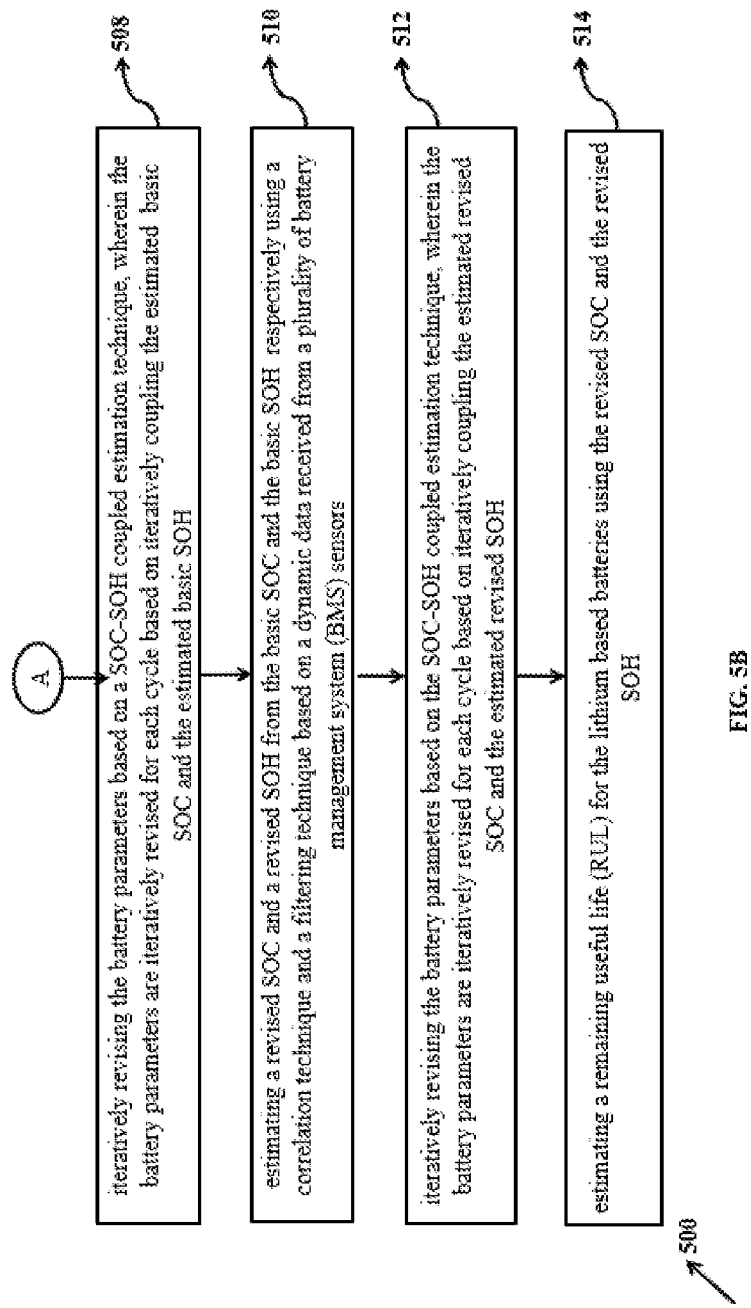

Functions of the components of the system are explained in conjunction with functional modules of the system (100) stored in the memory (104) and further explained in conjunction with flow diagram of FIGS. 5A and 5B.

Figure 2:
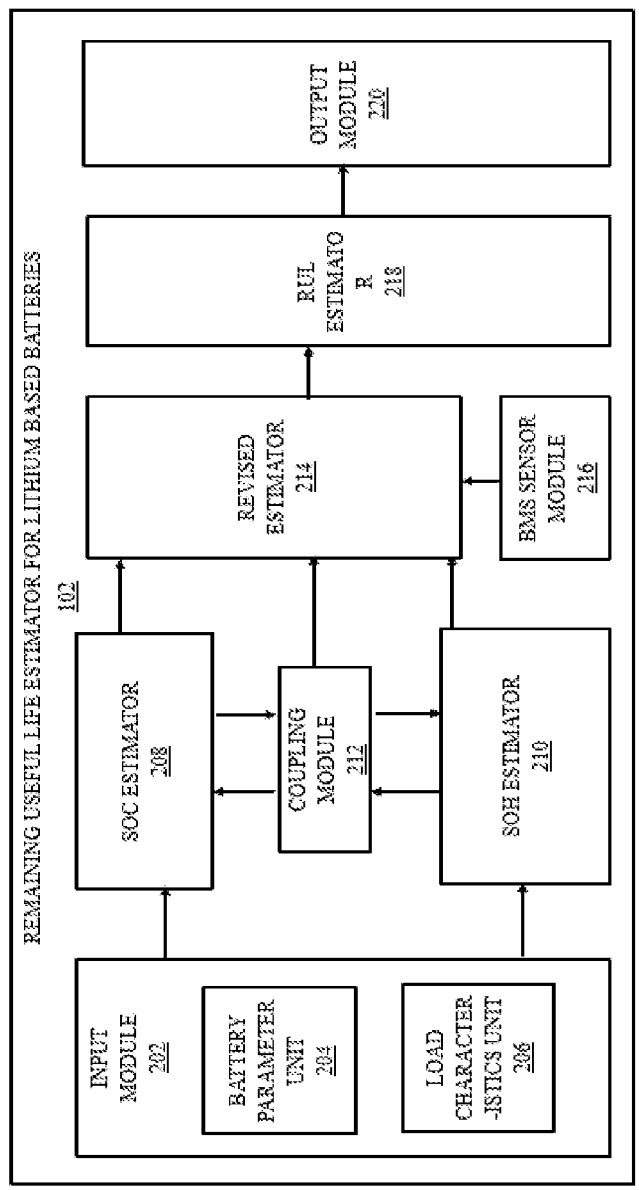
FIG. 2 is a functional block diagram according to some embodiments of the present disclosure, according to some embodiments of the present disclosure.

FIG. 2, with reference to FIG. 1, is a block diagram of various modules of remaining useful life estimator for lithium based batteries (102) for estimation of remaining useful life in lithium based batteries of the system 100 of FIG. 1 in accordance with an embodiment of the present disclosure.

In an embodiment of the present disclosure, the FIG. 2 illustrates the functions of the components of remaining useful life estimator for lithium based batteries (102) of the system (100). The system (100) for an remaining useful life estimator for lithium based batteries comprises an input module (202) that further comprises a battery parameter unit (204) and a load characteristics unit (206) is configured for receiving, by one or more hardware processors, a plurality of battery information of a lithium based battery from a plurality of sources.

The system (100) further comprises a SOC estimator (208) configured for estimating a basic state of charge (SOC) for the lithium based battery during charging/discharging in constant current (CC) and constant voltage (CV) mode based on a reduced order physics based modelling technique, using the battery parameters and the load characteristics. The system (100) further comprises a SOH estimator (210) configured for estimating a basic state of health (SOH) for the lithium based battery during charging/discharging in constant current (CC) and constant voltage (CV) modes, depending on a solid electrolyte interphase (SEI) formation using the battery parameters and the load characteristics based on a solvent diffusion theory technique.

The system (100) further comprises a coupling module (210) configured for iteratively revising the battery parameters based on a SOC-SOH coupled estimation technique, wherein the battery parameters are iteratively revised for each cycle based on iteratively coupling the estimated basic SOC and the estimated basic SOH and for iteratively revising the battery parameters based on the SOC-SOH coupled estimation technique, wherein the battery parameters are iteratively revised for each cycle based on iteratively coupling the estimated revised SOC and the estimated revised SOH. The system (100) further comprises a revised estimator (214) configured for estimating a revised SOC and a revised SOH from the basic SOC and the basic SOH respectively using a correlation technique and a filtering technique based on a dynamic data received from a plurality of battery management system (BMS) sensors (216), wherein the BMS sensors are configured for sharing the dynamic data that comprises of real time environment data that include a voltage sensor measurement and a current sensor measurement. The system (100) further comprises a RUL estimator (218) estimating a remaining useful life (RUL) for the lithium based batteries using the revised SOC and the revised SOH. The system (100) further comprises a display module (220) is configured for displaying the estimated remaining useful life (RUL) for the lithium based batteries.

The various modules of the system (100) for estimation of remaining useful life in lithium based batteries are implemented as at least one of a logically self-contained part of a software program, a self-contained hardware component, and/or, a self-contained hardware component with a logically self-contained part of a software program embedded into each of the hardware component that when executed perform the above method described herein.

According to an embodiment of the disclosure, the system (100) for estimation of remaining useful life in lithium based batteries comprises the input module (202) that is configured for receiving, by one or more hardware processors, a plurality of battery information of a lithium based battery from a plurality of sources. The input module (202) further comprises a battery parameter unit (204) and a load characteristics unit (206), wherein the battery parameter unit (204) is configured for the receiving a plurality of battery parameters and the load characteristics unit (206) is configured for receiving a plurality of load characteristics.

In an embodiment, the plurality of sources includes a user, an existing literature on battery material properties or a battery manufacturer.

In an embodiment, the battery parameters that are received from a user using the battery parameter unit (204) of the input module (202) includes a plurality of geometrical properties, a plurality of physical properties of various chemicals inside the battery, a plurality of properties of the products formed in the side reactions that leads to formation of a solid electrolyte interphase (SEI) and a plurality of electrochemical reaction related properties. The battery parameters further includes a molecular mass of SEI $m_S$, density of the SEI ($\rho_S$), a solvent diffusivity in the SEI layer ($D_S$) and a rate constant of the SEI layer formation ($k_S$). Further the geometrical properties are defined for a set of parameters that include of an anode, a cathode, a separator, and comprise of a set of dimensions and a porosity parameter. Further the physical properties of various chemicals within the battery includes a set of diffusivities (of Lithium in anode $D_{sn}$, cathode $D_{sp}$, and electrolyte $D_e$), a set of ionic conductivities in electrolyte ($\kappa^{eff}$, $\kappa_D^{eff}$) and a solid ($\sigma^{eff}$), transference numbers $t^0$, The battery parameter also include the set of electrochemical reaction related properties that comprise reaction constants ($j_0$), Butler-Volmer coefficients ($\alpha_a$, $\alpha_c$). The input parameters also include few other battery parameter related properties that include a Stoichiometric Li concentrations in positive ($\theta_{p0}$, $\theta_{p100}$) and negative electrodes ($\theta_{n0}$, $\theta_{n100}$) and maximum Li concentrations in positive ($c_{pmax}$) and negative electrodes ($c_{nmax}$).

The load characteristics received from the user using the load characteristics unit (206) of the input module (202) comprises of the charge/discharge characteristics of the lithium battery within a given time interval in constant current (CC) mode and constant voltage (CV) mode. In an embodiment, two modes are considered that include constant current (CC) mode and constant voltage (CV) mode wherein the constant current (CC) mode is a constant value of current is drawn from the lithium battery, which is positive/negative depending on whether the lithium battery is discharging/charging respectively. Further the constant voltage (CV) mode, in which the battery is charged such that the voltage across it is kept constant. Further for a discharge profile in which the discharge current varies with time, the current is specified as a summation of multiple constant current modes over smaller intervals. Hence, the system (100) described here works when the lithium based battery is discharged over several CC modes and charged in any combination of the hybrid CC-CV mode.

According to an embodiment of the disclosure, the system (100) for estimation of remaining useful life in lithium based batteries comprises the SOC estimator (208) configured for estimating a basic state of charge (SOC) for the lithium based battery during charging/discharging in constant current (CC) and constant voltage (CV) mode based on a reduced order physics based modelling technique, using the battery parameters and the load characteristics In an embodiment the reduced order physics based modelling technique is based on at least one of the electrochemical models that include a pseudo two dimensional (P2D) model using single particle assumption. Considering a use case example of SOC estimation using the pseudo two dimensional (P2D) model using single particle assumption with battery parameters and load characteristics as inputs. The disclosed reduced order physics based model is based on governing equations of the pseudo two dimensional (P2D) electrochemical model using model order reduction techniques that include spatial averaging, treating each electrode as a single particle. The equations of the P2D model consist of governing equations includes a electrolyte concentration ($c_e$), a solid concentration ($c_{sp}$, $c_{sn}$), a current conservation, a Butler-Volmer reaction kinetics, the disclosed methodology to obtain the reduced order physics based model equations from the P2D model is described in further sentences. In the reduced order physics based model, the electrolyte concentration is a constant along the battery width coordinate x wherein a solid and a electrolyte potentials, $\phi_s$ and $\phi_e$ respectively is solved analytically. Further, using finite difference method, the solid concentration equation is discretized in the radial domain to convert a Partial Differential Equation (PDE) into an Ordinary Differential Equation (ODE). Further the P2D equations is converted to reduced to order physics based model equations to enable faster computation of solutions. In the constant-current (CC) mode of operation in the SOC estimator (208), the SOC is estimated using the solid concentration $c_{sp}$, $c_{sn}$, the battery state of charge (SOC) and terminal voltage (V) (including contributions from open circuit voltage (OCV), potential drop in the electrolyte and Butler-Volmer overpotentials) is computed, which can be expressed as:

$$SOC = \frac{\theta_p - \theta_{p0}}{\theta_{p100} - \theta_{p0}} \quad (1)$$

where $\theta_p = c_{sp}/c_{pmax}$ is the dimensionless solid concentration at the solid-electrolyte interface, $c_{pmax}$ is the maximum Li concentration in the positive electrode and $\theta_{p0}$, $\theta_{p100}$ are the Stoichiometric coefficients for the positive electrode.

Further for a constant voltage (CV) mode of operation, an additional equation for current evolution as a function of time, which can be expressed as;

$$\frac{dV}{dt} = 0, \quad (2)$$

where $V=f(I, c_{sp}, c_{sn})$ is a known function of current I and solid concentrations $c_{sp}$ and $c_{sn}$ in the cathode and the anode respectively.

Further based on above equation, the current evolution equation to be referred to as a known function of the solid concentrations in the cathode and anode and their time derivatives can be expressed as shown below;

$$\frac{dI}{dt} = g\left(c_{sp}, c_{sn}, \frac{dc_{sp}}{dt}, \frac{dc_{sn}}{dt}\right) \quad (3)$$

According to an embodiment of the disclosure, the system (100) for estimation of remaining useful life in lithium based batteries comprises the SOH estimator (210) configured for estimating a basic state of health (SOH) for the lithium based battery during charging/discharging in constant current (CC) and constant voltage (CV) modes, depending on a solid electrolyte interphase (SEI) formation using the battery parameters and the load characteristics based on a solvent diffusion theory technique. In an embodiment the solvent diffusion theory for the formation of the solid electrolyte interphase (SEI) is based on a plurality of parameters of SEI that includes a SEI layer growth parameter and a capacity loss due to SEI growth parameter.

In an embodiment the SOH estimator (210) estimates the capacity loss after each cycle using battery parameters, load characteristics and the SOC value from the SOC estimator (208). The SOH estimator (210) is configured to solve the equations based on solvent diffusion theory for the SEI layer growth and the capacity loss due to SEI growth, wherein a set of properties of the SEI layer including, molar mass (m_s) density (ρ_s), solvent diffusivity in the SEI layer (D_s) and the reaction constant for SEI formation (k_s) are used to obtain remaining battery capacity (Q) and SEI layer thickness (s).

The SOC estimator (208) and SOH estimator (210) are in constant communication with each other, hence the estimated SOH (capacity loss) is shared to the SOC estimator (208) to get a coupled estimate of the SOC in the next cycle, which is explained in the next section.

According to an embodiment of the disclosure, the system (100) for estimation of remaining useful life in lithium based batteries comprises the coupling module (210) configured for iteratively revising the battery parameters based on a SOC-SOH coupled estimation technique.

Figure 3:
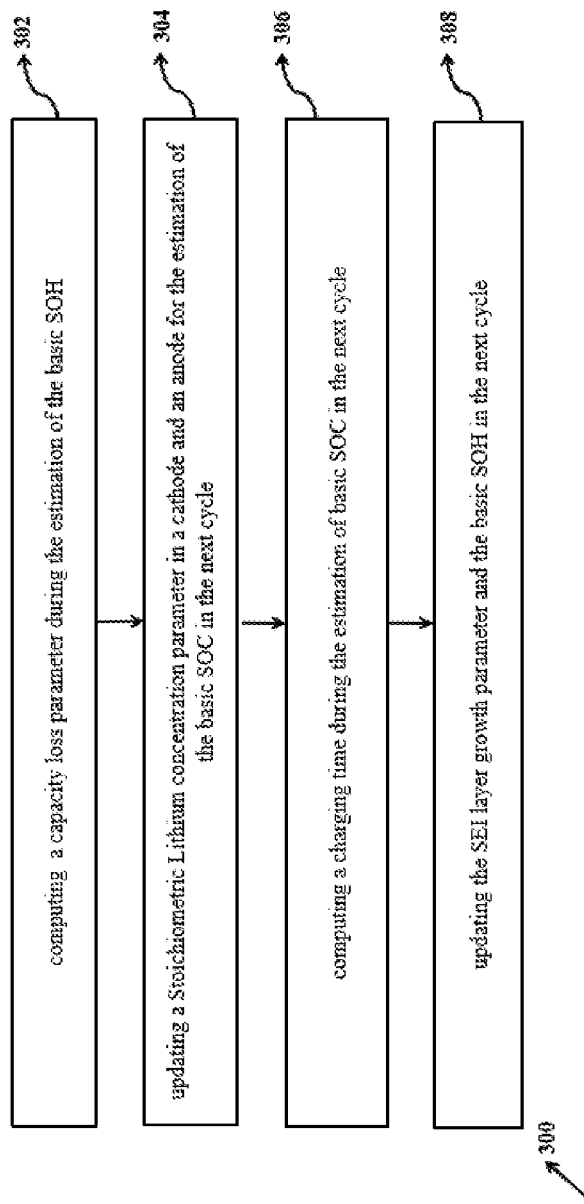
FIG. 3 is a flow diagram illustrating a method for in accordance with some embodiments of the present disclosure.

In an embodiment, the battery parameters are iteratively revised based on a SOC-SOH coupled estimation technique, wherein the battery parameters are iteratively revised for each cycle based on iteratively coupling the estimated basic SOC and the estimated basic SOH, which is illustrated in a flowchart of FIG. 3 and comprises of the following steps:

At step 302, the method (300) includes computing a capacity loss parameter (ΔQ), which is further used to calculate the updated battery capacity Q at the end of each cycle. This is further used to estimate basic SOH expressed as $$SOH_{basic} = Q/Q_0,$$

where $Q_0$ is the initial battery capacity at the beginning of the first cycle.

In the next step at 304, the method (300) includes updating a Stoichiometric Lithium concentration parameter in a cathode ($\theta_{p0}$) and a anode ($\theta_{n100}$) for the estimation of the basic SOC in the next cycle. The values $\theta_{n100}$ and $\theta_{p0}$ are updated after every cycle in such a manner that Stoichiometric differences $\theta_{n100} - \theta_{n0}$ and $\theta_{p0} - \theta_{p100}$, which are proportional to the battery capacity Q, are scaled based on the basic SOH at the end of that cycle, wherein a positive and a negative electrode capacities are nearly equal and that degradation side reactions happen only at the negative electrode.

In the next step at 306, the method (300) includes computing a charging time ($t_{ch}$) during the estimation of basic SOC in the next cycle. The charging time is the time taken for the battery's basic SOC to change between the predefined limits $SOC_{initial}$ and $SOC_{final}$. The charging time ($t_{ch}$) is obtained from the solution of the solid concentration equation in the reduced order SOC module.

In the next step at 308, the method (300) includes updating the SEI layer growth parameter and the basic SOH in the next cycle.

Figure 4:
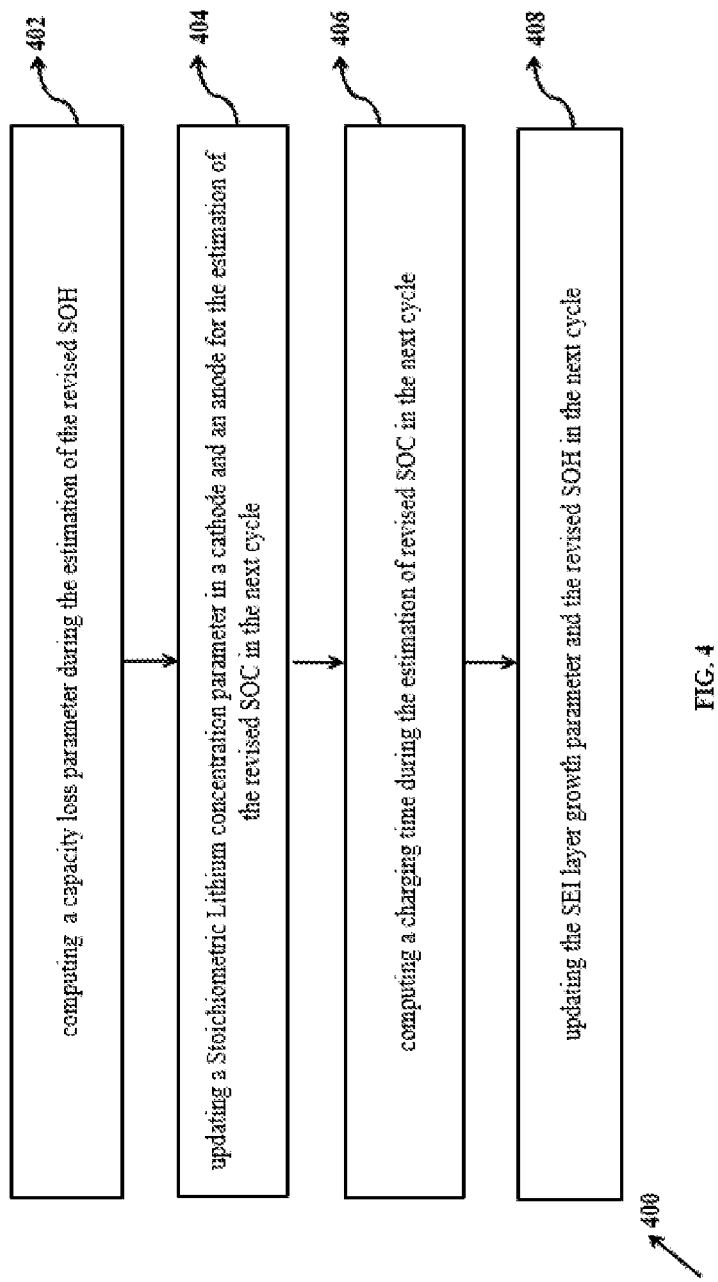
FIG. 4 is a flow diagram illustrating a method for according to some embodiments of the present disclosure.

In an embodiment, the battery parameters are iteratively revised based on the SOC-SOH coupled estimation technique, wherein the battery parameters are iteratively revised for each cycle based on iteratively coupling the estimated revised SOC and the estimated revised SOH, which is illustrated in a flowchart of FIG. 4 and comprises of the following steps:

At step 402, the method (400) includes computing a capacity loss parameter (ΔQ), which is further used to calculate the updated battery capacity Q at the end of each cycle. This is further used to estimate revised SOH expressed as $$SOH_{revised} = Q/Q_0,$$

where $Q_0$ is the initial battery capacity at the beginning of the first cycle.

In the next step at 404, the method (400) includes updating a Stoichiometric Lithium concentration parameter in a cathode ($\theta_{p0}$) and a anode ($\theta_{n100}$) for the estimation of the revised SOC in the next cycle. The values $\theta_{n100}$ and $\theta_{p0}$ are updated after every cycle in such a manner that Stoichiometric differences $\theta_{n100} - \theta_{n0}$ and $\theta_{p0} - \theta_{p100}$, which are proportional to the battery capacity Q, are scaled based on the revised SOH at the end of that cycle, wherein a positive and a negative electrode capacities are nearly equal and that degradation side reactions happen only at the negative electrode.

In the next step at 406, the method (400) includes computing a charging time ($t_{ch}$) during the estimation of revised SOC in the next cycle. The charging time ($t_{ch}$) is the time taken for the battery's revised SOC to change between the predefined limits $SOC_{initial}$ and $SOC_{final}$.

In the next step at 408, the method (400) includes updating the SEI layer growth parameter and the revised SOH in the next cycle.

According to an embodiment of the disclosure, the system (100) for estimation of remaining useful life in lithium based batteries comprises the battery management system (BMS) sensor module (216) is configured for sharing a dynamic data that comprises of real time environment data. The real time environment data includes a voltage sensor measurement and a current sensor measurement.

In an embodiment the battery management system (BMS) sensor module (216) comprises a plurality of BMS sensors that include sensors to measure a voltage, a current and a temperature for real time monitoring of a lithium battery.

According to an embodiment of the disclosure, the system (100) for estimation of the remaining useful life (RUL) in lithium based batteries comprises the revised estimator (214) configured for estimating a revised SOC and a revised SOH from the basic SOC and the basic SOH respectively using a correlation technique and a filtering technique based on the dynamic data received from the plurality of battery management system (BMS) sensors (216).

In an embodiment the revised SOC and the revised SOH is estimated in the CC/CV mode as calculated from the basic SOC and the basic SOH respectively using a correlation technique and a filtering technique based on the dynamic data received from the plurality of battery management system (BMS) sensors of the BMS sensor module (216). The correlation technique is based on a standard correlation techniques that includes linear regression, support vector regression and the filtering techniques is based on a standard filtering techniques that includes a kalman filtering technique, an extended kalman filtering (EKF) technique, a unscented kalman filtering (UKF) technique.

In an embodiment, considering a use case example of estimating the revised SOC and the revised SOH based on extended kalman filtering technique based on the dynamic data received from the plurality of battery management system (BMS) sensors. The extended kalman filtering technique estimates the revised SOC and revised SOH by optimally combining the model predictions and sensor measurements of the revised SOC and revised SOH. Further correlation techniques may also be applied to further correct/revise any inaccurate estimation (due to like high C rate discharge conditions), wherein the correlation techniques used are well know techniques that includes a linear regression, a support vector regression technique.

According to an embodiment of the disclosure, the system (100) for estimation of remaining useful life in lithium based batteries comprises the RUL estimator (218) that is configured for estimating a remaining useful life (RUL) for the lithium based batteries using the revised SOC and the revised SOH.

In an embodiment the RUL is computed using the revised SOC and the revised SOH, which can be expressed as shown below:

$$RUL=[RevisedSOC, RevisedSOH]$$

Here revised SOC represents the available battery energy during a particular cycle of operation and revised SOH represents the long term reduction in battery energy. Together they represent the remaining useful life (RUL) of the battery.

According to an embodiment of the disclosure, the system (100) for estimation of remaining useful life in lithium based batteries comprises the display module (220) is configured for displaying the estimated remaining useful life (RUL) for the lithium based batteries.

In one embodiment, FIG. 5A and FIG. 5B is an exemplary flow diagram for of classification of time series signal on edge devices implemented by the system of FIG. 1 and includes the following steps:

At step 502, the method (500) includes receiving, by one or more hardware processors, a plurality of battery information of a lithium based battery in the input module (202) from a plurality of sources, wherein the received plurality of battery information includes a plurality of battery parameters and a plurality of load characteristics.

In an embodiment, the plurality of battery parameters are received in the includes a plurality of geometrical properties, a plurality of physical properties of chemicals inside the battery, a plurality of properties of the products formed in the side reactions that leads to formation of solid electrolyte interphase (SEI), a plurality of electrochemical reaction related properties and the plurality of load characteristics is received in the load characteristics unit (206) of the input module (202) comprises of the charge/discharge characteristics of the lithium battery within a given time interval in constant current (CC) mode and constant voltage (CV) mode.

In the next step at 504, the method (500) includes estimating a basic state of charge (SOC) for the lithium based battery in the SOC estimator (208) during charging/discharging in constant current (CC) and constant voltage (CV) modes based on a reduced order physics based modelling technique, using the battery parameters and the load characteristics.

In an embodiment, the reduced order physics based modelling technique is based on at least one of the electrochemical models that include a pseudo two dimensional (P2D) technique model using single particle assumption.

In the next step at 506, the method (500) includes estimating a basic state of health (SOH) for the lithium based battery in the SOH estimator (210) during charging/discharging in constant current (CC) and constant voltage (CV) modes, depending on a solid electrolyte interphase (SEI) formation using the battery parameters and the load characteristics based on a solvent diffusion theory technique.

In an embodiment, the solvent diffusion theory for the formation of the solid electrolyte interphase (SEI) is based on a plurality of parameters of SEI that includes a SEI layer growth parameter and a capacity loss due to SEI growth parameter.

In the next step at 508, the method (500) includes iteratively revising the battery parameters based on a SOC-SOH coupled estimation technique in the coupling module (212), wherein the battery parameters are iteratively revised for each cycle based on iteratively coupling the estimated basic SOC and the estimated basic SOH.

In an embodiment, the battery parameters are iteratively revised based on a SOC-SOH coupled estimation technique, wherein the battery parameters are iteratively revised for each cycle based on iteratively coupling the estimated basic SOC and the estimated basic SOH, which is illustrated in FIG. 3 and comprises of the several steps that include computing a capacity loss parameter during the estimation of the basic SOH, updating a Stoichiometric Lithium concentration parameter in a cathode ($\theta_{po}$) and a anode ($\theta_{n100}$) for the estimation of the basic SOC in the next cycle, computing a charging time during the estimation of basic SOC in the next cycle and updating the SEI layer growth parameter and the basic SOH in the next cycle.

In the next step at 510, the method (500) includes estimating a revised SOC and a revised SOH from the basic SOC and the basic SOH respectively using a correlation technique and a filtering technique in the revised estimator (214) based on a dynamic data received from a plurality of battery management system (BMS) sensors.

In an embodiment, the revised estimator (214) is configured for estimating the revised SOC and the revised SOH by revising the basic SOC and the basic SOH based on the correlation technique and the filtering technique, wherein the correlation technique is based on standard correlation techniques that includes linear regression, support vector regression and the filtering techniques is based on standard filtering techniques that includes a kalman filtering technique, an extended kalman filtering (EKF) technique, a unscented kalman filtering (UKF) technique. Further the battery management system (BMS) sensor module (216) is configured for sharing the dynamic data that comprises of real time environment data that include a voltage sensor measurement and a current sensor measurement.

In the next step at 512, the method (500) includes iteratively revising the battery parameters based on the SOC-SOH coupled estimation technique in the coupling module (212), wherein the battery parameters are iteratively revised for each cycle based on iteratively coupling the estimated revised SOC and the estimated revised SOH.

In an embodiment, the battery parameters are iteratively revised based on the SOC-SOH coupled estimation technique, wherein the battery parameters are iteratively revised for each cycle based on iteratively coupling the estimated revised SOC and the estimated revised SOH, which is illustrated in FIG. 4 and comprises of the several steps that include computing a capacity loss parameter during the estimation of the revised SOH, updating a Stoichiometric Lithium concentration parameter in a cathode ($\theta_{po}$) and a anode ($\theta_{n100}$) for the estimation of the revised SOC in the next cycle, computing a charging time during the estimation of revised SOC in the next cycle and updating the SEI layer growth parameter and the revised SOH in the next cycle.

In the next step at 514, the method (500) includes estimating a remaining useful life (RUL) for the lithium based batteries in the RUL estimator (218) using the revised SOC and the revised SOH. In an embodiment the RUL is computed using the revised SOC and the revised SOH, which can be expressed as shown below:

$$RUL=[RevisedSOC, RevisedSOH]$$

Here revised SOC represents the available battery energy during a particular cycle of operation and revised SOH represents the long term reduction in battery energy. Together they represent the remaining useful life (RUL) of the battery.

The estimated remaining useful life (RUL) for the lithium based batteries is displayed in the display module (220).

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

Figure 6A:
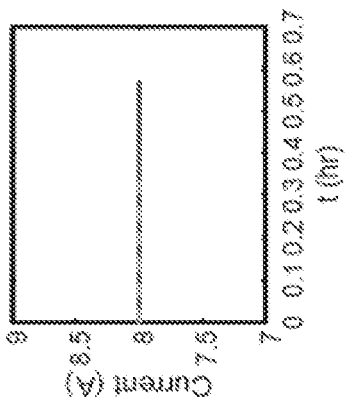
FIG. 6A, FIG. 6B and FIG. 6C are graphs illustrating estimation of SOC for constant current (CC) charging mode according to some embodiments of the present disclosure
Figure 6B:
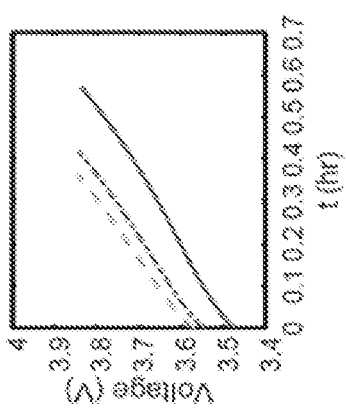
Figure 6C:
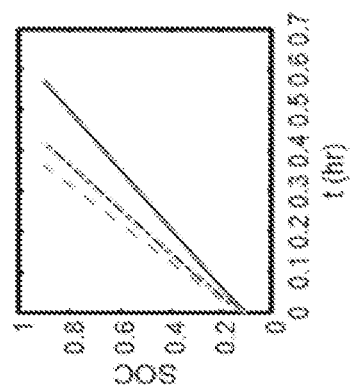
Figure 7:
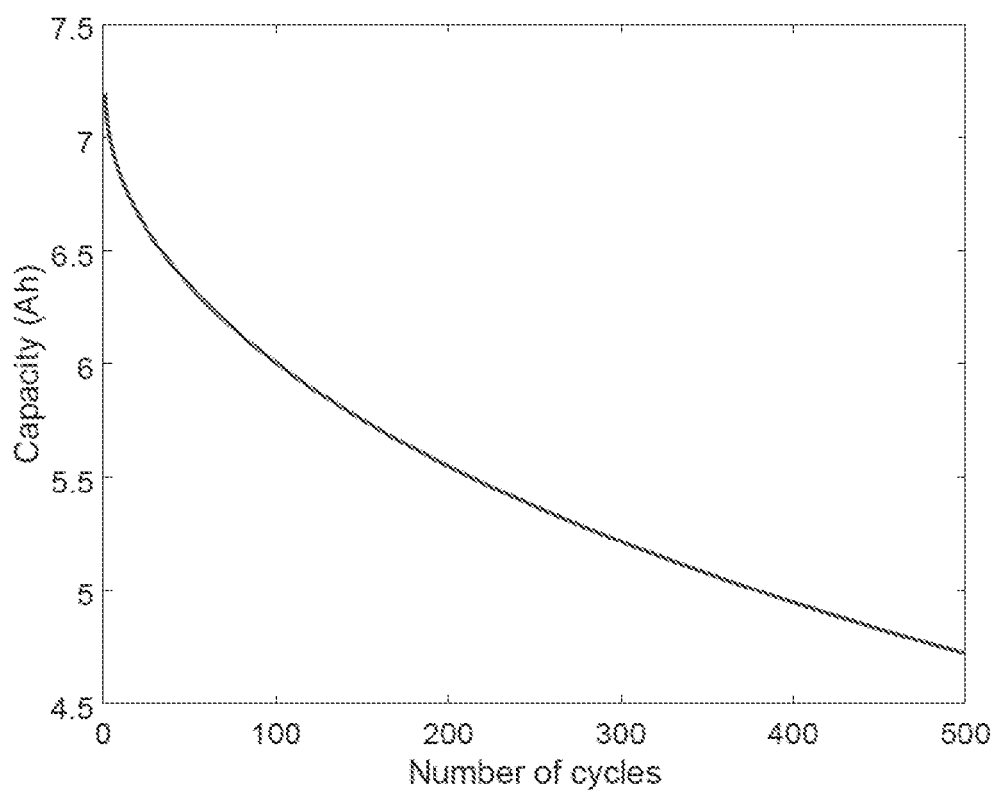
FIG. 7 is a graph illustrating the estimation of SOH during multiple cycles of CC charging conditions according to some embodiments of the present disclosure
Figure 8:
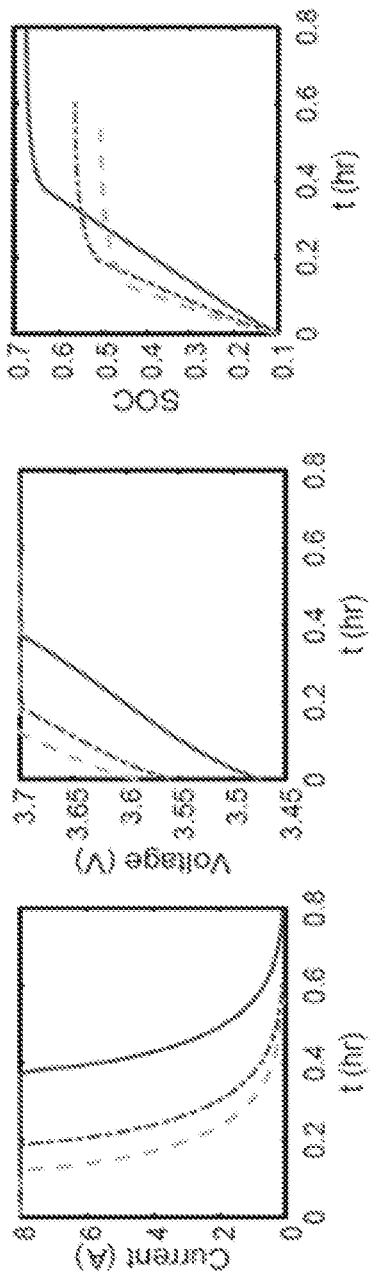
FIG. 8A, FIG. 8B and FIG. 8C are graphs illustrating estimation of SOC for constant current-constant voltage (CC-CV) charging mode according to some embodiments of the present disclosure.
Figure 9:
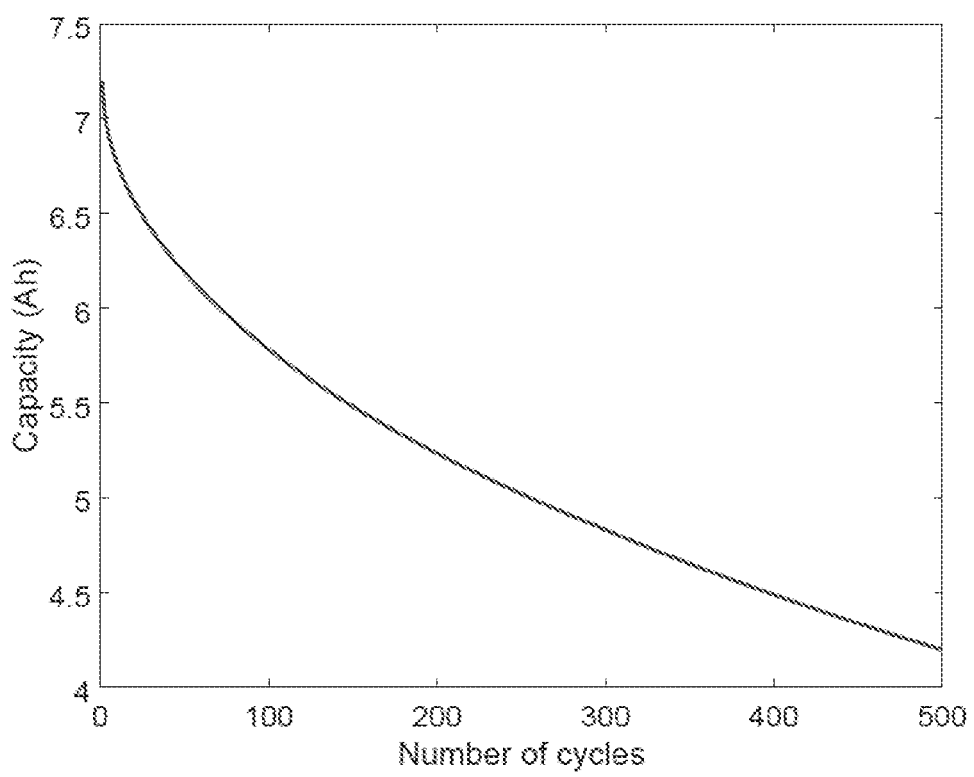
FIG. 9 is a graph illustrating the estimation of SOH during multiple cycles of CC-CV charging conditions according to some embodiments of the present disclosure.

Case Studies:

Case study 1 (Estimation of SOC and Estimation of SOH using reduced order physics based modelling techniques in CC and CC-CV mode): The results for estimation of SOC and estimation of SOC obtained using the disclosed reduced order physics based modelling techniques is conducted for two scenarios that include scenario one with constant current (CC) charging mode and scenario two with constant current-constant voltage (CC-CV) charging mode with cutoff voltage of 3.7 V. The estimation of SOC for constant current (CC) charging mode is illustrated in FIG. 6A, with charging current at 8 Amperes for 500 cycles of charging, wherein the results are shown for cycle numbers 1 (solid line), 250 (dash-dot line) and 500 (dashed line). Further the difference in the voltage and the SOH estimated for different cycle numbers of CC charging conditions is illustrated in FIG. 7, wherein the is due to battery capacity loss, which is obtained from the estimated SOH. The estimation of SOC is illustrated in FIG. 6B and FIG. 6C for SOC estimated for constant current (CC) charging mode. The estimation of SOC for constant current-constant voltage (CC-CV) charging mode is illustrated in FIG. 8A, FIG. 8B and FIG. 8C with charging current at 8 Amperes for 500 cycles of charging, wherein the results are shown for cycle numbers 1 (solid line), 250 (dash-dot line) and 500 (dashed line). Further the difference in the voltage and the SOH estimated for different cycle numbers of CC-CV charging conditions/modes is illustrated in FIG. 9, wherein the is due to battery capacity loss, which is obtained from the estimated SOH.

Figure 10A:
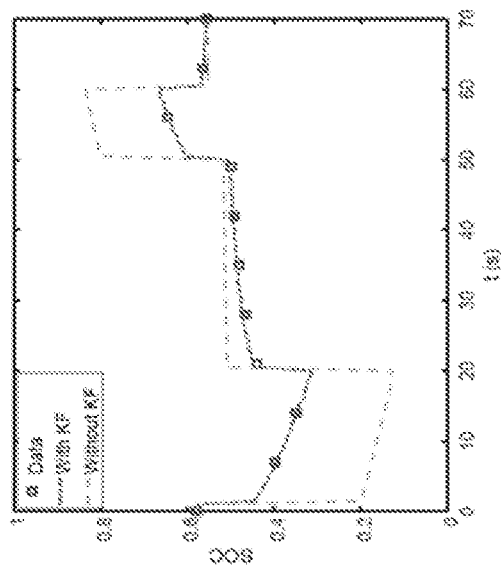
FIG. 10A and FIG. 10.B are graph illustrating corrected/revised coupled estimation of SOC using Extended Kalman Filtering (EKF) technique according to some embodiments of the present disclosure
Figure 10B:
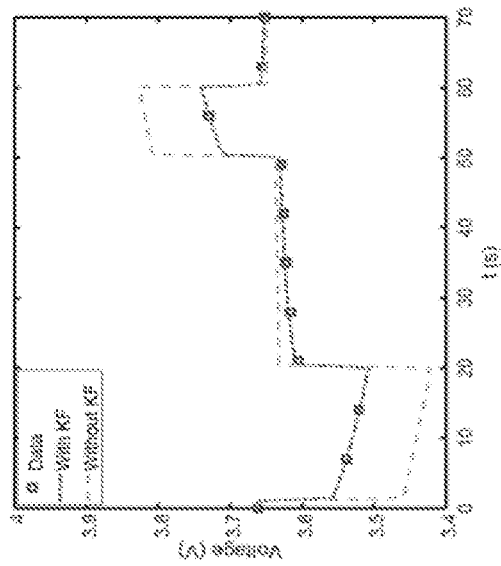

Case study 2 (Corrected/revised coupled estimation of SOC and SOH using Extended Kalman Filtering (EKF) technique):
The results for corrected/revised coupled estimation of SOC using Extended Kalman Filtering (EKF) technique is shown in FIG. 10A and FIG. 10B using the disclosed coupling module (212). The disclosed EKF technique revises/corrects the estimated SOC and SOH, if they deviate significantly from the more accurate data based on the dynamic data (BMS sensor measurements) of voltage and current. The experiment has been conducted in constant current (CC) discharge at 30 A between 1 s to 20 s, followed by open circuit relaxation till 50 s, followed by a constant current charging at 22.5 A from 50 s to 60 s, followed by open circuit relaxation till 70 s.

Figure 11:
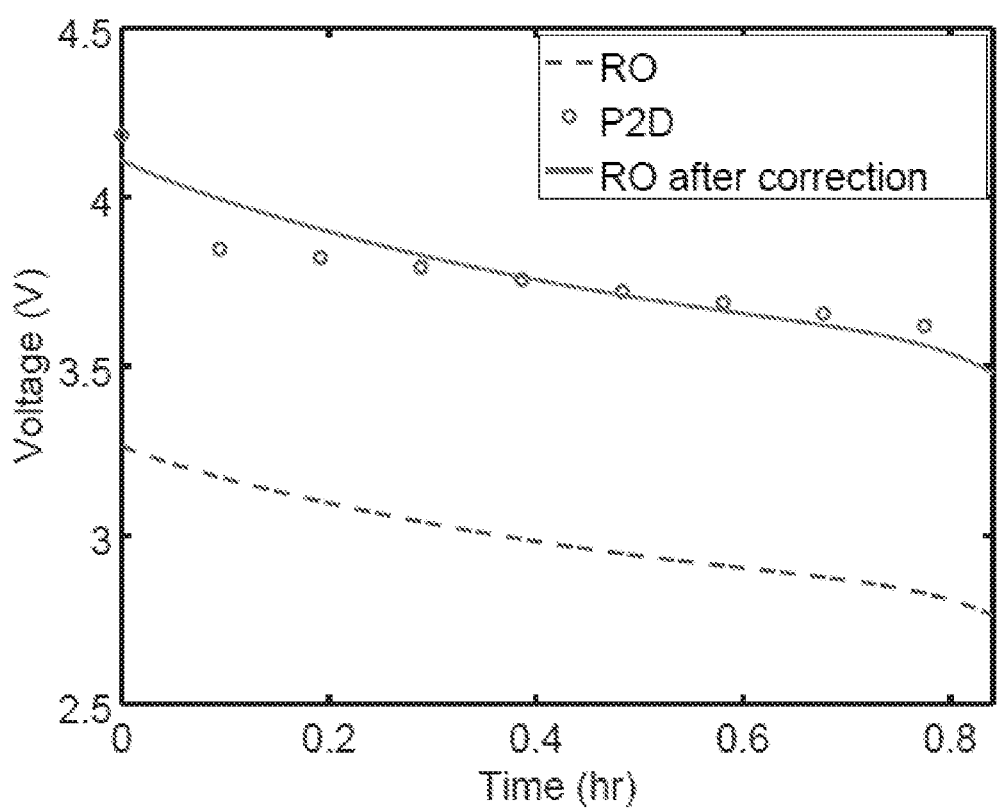
FIG. 11 is a graph illustrating voltage predictions for revised SOC using correlations obtained from a pseudo two dimensional (P2D) model according to some embodiments of the present disclosure

Case study 3 (Corrected/revised coupled estimation of SOC and SOH using disclosed a pseudo two dimensional (P2D) technique model using single particle assumption):
The results for coupled estimation of SOC and SOH with a voltage during 1C discharge in a battery with electrolyte concentration of 4 M. As the reduced order physics based model does not account for the concentration polarization effects at high electrolyte concentrations, it is expected to give inaccurate results at 4 M electrolyte concentration. Thus, data obtained from P2D model, stored as look-up tables, to correct/revised the estimated SOC. The corrected/revised SOC is as shown in FIG. 11, wherein the voltage predictions show better agreement with the data obtained from the P2D model.

The embodiments of present disclosure herein addresses the problem of estimation of remaining useful life in lithium based batteries based on coupled estimation of a state of charge (SOC) and a state of health (SOH) during charging/discharging in constant current (CC) and constant voltage (CV) modes. The embodiment thus provides RUL estimation technique that considers the inter-dependency of SOC-SOH and influence of internal-external parameters/factors during the coupled estimation of SOC-SOH. Moreover, the embodiments herein further provides the coupled estimation of SOC and SOH based on a reduced order physics based modelling technique and considers the influence real time environment obtained using real-time dynamic data obtained by several sensors during the coupled estimation of SOC-SOH.

It is to be understood that the scope of the protection is extended to such a program and in addition to a computer-readable means having a message therein; such computer-readable storage means contain program-code means for implementation of one or more steps of the method, when the program runs on a server or mobile device or any suitable programmable device. The hardware device can be any kind of device which can be programmed including e.g. any kind of computer like a server or a personal computer, or the like, or any combination thereof. The device may also include means which could be e.g. hardware means like e.g. an application-specific integrated circuit (ASIC), a field-programmable gate array (FPGA), or a combination of hardware and software means, e.g. an ASIC and an FPGA, or at least one microprocessor and at least one memory with software processing components located therein. Thus, the means can include both hardware means and software means. The method embodiments described herein could be implemented in hardware and software. The device may also include software means. Alternatively, the embodiments may be implemented on different hardware devices, e.g. using a plurality of CPUs.

The embodiments herein can comprise hardware and software elements. The embodiments that are implemented in software include but are not limited to, firmware, resident software, microcode, etc. The functions performed by various components described herein may be implemented in other components or combinations of other components. For the purposes of this description, a computer-usable or computer readable medium can be any apparatus that can comprise, store, communicate, propagate, or transport the program for use by or in connection with the instruction execution system, apparatus, or device.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope of disclosed embodiments being indicated by the following claims.

We claim:

1. A processor-implemented method (500) for estimation of remaining useful life in lithium based batteries, the method comprising:
   receiving, by one or more hardware processors, a plurality of battery information of a lithium based battery from a plurality of sources, wherein the received plurality of battery information includes a plurality of battery parameters and a plurality of load characteristics (502);
   estimating a basic state of charge (SOC) for the lithium based battery during charging/discharging in constant current (CC) and constant voltage (CV) modes based on a reduced order physics based modelling technique, using the battery parameters and the load characteristics (504);
   estimating a basic state of health (SOH) for the lithium based battery during charging/discharging in constant current (CC) and constant voltage (CV) modes, depending on a solid electrolyte interphase (SEI) formation using the battery parameters and the load characteristics based on a solvent diffusion theory technique (506);
   iteratively revising the battery parameters based on a SOC-SOH coupled estimation technique, wherein the battery parameters are iteratively revised for each cycle based on iteratively coupling the estimated basic SOC and the estimated basic SOH (508);
   estimating a revised SOC and a revised SOH from the basic SOC and the basic SOH respectively using a correlation technique and a filtering technique based on a dynamic data received from a plurality of battery management system (BMS) sensors (510);
   iteratively revising the battery parameters based on the SOC-SOH coupled estimation technique, wherein the battery parameters are iteratively revised for each cycle based on iteratively coupling the estimated revised SOC and the estimated revised SOH (512); and
   estimating a remaining useful life (RUL) for the lithium based batteries using the revised SOC and the revised SOH (514).

2. The method of claim 1, wherein the estimated remaining useful life (RUL) for the lithium based batteries is displayed on a display module.

3. The method of claim 1, wherein the plurality of battery parameters includes a plurality of geometrical properties, a plurality of physical properties of chemicals inside the battery, a plurality of properties of the products formed in the side reactions that leads to formation of solid electrolyte interphase (SEI), a plurality of electrochemical reaction related properties and the plurality of load characteristics includes charge/discharge characteristics of the lithium battery within a given time interval in constant current (CC) mode and constant voltage (CV) mode.

4. The method of claim 1, the reduced order physics based modelling technique is based on at least one of the electrochemical models that include a pseudo two dimensional (P2D) model using single particle assumption.

5. The method of claim 1, wherein the solvent diffusion theory for the formation of the solid electrolyte interphase (SEI) is based on a plurality of parameters of SEI that includes a SEI layer growth parameter and a capacity loss due to SEI growth parameter.

6. The method of claim 1, wherein the step of the coupled estimation technique includes iteratively coupling the estimated basic SOC and the estimated basic SOH, which comprised of the following steps;
   computing a capacity loss parameter during the estimation of the basic SOH (302);
   updating a Stoichiometric Lithium concentration parameter in a cathode ($\theta_{po}$) and a anode ($\theta_{n100}$) for the estimation of the basic SOC in the next cycle (304);
   computing a charging time during the estimation of basic SOC in the next cycle (306); and
   updating the SEI layer growth parameter and the basic SOH in the next cycle (308).

7. The method of claim 1, for estimating the revised SOC and the revised SOH by revising the basic SOC and the basic SOH based on the correlation technique and the filtering technique, wherein the correlation technique is based on a standard correlation techniques that includes linear regression, support vector regression and the filtering techniques is based on a standard filtering techniques that includes a kalman filtering technique, an extended kalman filtering (EKF) technique, a unscented kalman filtering (UKF) technique.

8. The method of claim 1, wherein the step of the coupled estimation technique includes iteratively coupling the estimated revised SOC and the estimated revised SOH, which comprised of the following steps;
   computing a capacity loss parameter during the estimation of the revised SOH (402);
   updating a Stoichiometric Lithium concentration parameter in a cathode ($\theta_{po}$) and a anode ($\theta_{n100}$) for the estimation of the revised SOC in the next cycle (404);

computing a charging time during the estimation of revised SOC in the next cycle (406); and updating the SEI layer growth parameter and the revised SOH in the next cycle (408).

9. The method of claim 1, the dynamic data received by one or more plurality of battery management system (BMS) sensors comprises of real time environment data that include a voltage sensor measurement and a current sensor measurement.

10. A system (100) for estimation of remaining useful life in lithium based batteries comprising:

a remaining useful life estimator for lithium based batteries for estimation of remaining useful life in lithium based batteries;

a memory for storing instructions;

one or more communication interfaces; and one or more hardware processors communicatively coupled to the memory using the one or more communication interfaces, wherein the one or more first hardware processors are configured to execute programmed instructions stored in the one or more first memories, to:

receive a plurality of battery information of a lithium based battery from a plurality of sources, wherein the received plurality of battery information includes a plurality of battery parameters and a plurality of load characteristics;

estimate a basic state of charge (SOC) for the lithium based battery during charging/discharging in constant current (CC) and constant voltage (CV) modes based on a reduced order physics based modelling technique, using the battery parameters and the load characteristics;

estimate a basic state of health (SOH) for the lithium based battery during charging/discharging in constant current (CC) and constant voltage (CV) modes, depending on a solid electrolyte interphase (SEI) formation using the battery parameters and the load characteristics based on a solvent diffusion theory technique;

iteratively revise the battery parameters based on a SOC-SOH coupled estimation technique, wherein the battery parameters are iteratively revised for each cycle based on iteratively coupling the estimated basic SOC and the estimated basic SOH;

estimate a revised SOC and a revised SOH from the basic SOC and the basic SOH respectively using a correlation technique and a filtering technique based on a dynamic data received from a plurality of battery management system (BMS) sensors;

iteratively revise the battery parameters based on the SOC-SOH coupled estimation technique, wherein the battery parameters are iteratively revised for each cycle based on iteratively coupling the estimated revised SOC and the estimated revised SOH; and estimate and display a remaining useful life (RUL) for the lithium based batteries using the revised SOC and the revised SOH.

11. The system of claim 10 is configured for performing the coupled estimation technique that includes iteratively coupling the estimated basic SOC and the estimated basic SOH, which comprised of the following steps;

computing a capacity loss parameter during the estimation of the basic SOH;

updating a Stoichiometric Lithium concentration parameter in a cathode ($\theta_{p0}$) and a anode ($\theta_{n100}$) for the estimation of the basic SOC in the next cycle;

computing a charging time during the estimation of basic SOC in the next cycle; and updating the SEI layer growth parameter and the basic SOH in the next cycle.

12. The system of claim 10 is configured for performing the coupled estimation technique that includes iteratively coupling the estimated revised SOC and the estimated revised SOH, which comprised of the following steps;

computing a capacity loss parameter during the estimation of the revised SOH;

updating a Stoichiometric Lithium concentration parameter in a cathode ($\theta_{p0}$) and a anode ($\theta_{n100}$) for the estimation of the revised SOC in the next cycle;

computing a charging time during the estimation of revised SOC in the next cycle; and updating the SEI layer growth parameter and the revised SOH in the next cycle.

13. The system of claim 10 is configured for estimating the revised SOC and the revised SOH by revising the basic SOC and the basic SOH based on the correlation technique and the filtering technique, wherein the correlation technique is based on standard correlation techniques that includes linear regression, support vector regression and the filtering techniques is based on standard filtering techniques that includes a kalman filtering technique, an extended kalman filtering (EKF) technique, a unscented kalman filtering (UKF) technique.

14. The of claim 10 is configured for sharing the dynamic data that comprises of real time environment data that include a voltage sensor measurement and a current sensor measurement.

15. A non-transitory computer-readable medium having embodied thereon a computer readable program for estimation of remaining useful life in lithium based battery wherein the computer readable program, when executed by one or more hardware processors, cause:

receiving a plurality of battery information of a lithium based battery from a plurality of sources, wherein the received plurality of battery information includes a plurality of battery parameters and a plurality of load characteristics, estimating a basic state of charge (SOC) for the lithium based battery during charging/discharging in constant current (CC) and constant voltage (CV) modes based on a reduced order physics based modelling technique, using the battery parameters and the load characteristics;

estimating a basic state of health (SOH) for the lithium based battery during charging/discharging in constant current (CC) and constant voltage (CV) modes, depending on a solid electrolyte interphase (SEI) formation using the battery parameters and the load characteristics based on a solvent diffusion theory technique;

iteratively revising the battery parameters based on a SOC-SOH coupled estimation technique, wherein the battery parameters are iteratively revised for each cycle based on iteratively coupling the estimated basic SOC and the estimated basic SOH;

estimating a revised SOC and a revised SOH from the basic SOC and the basic SOH respectively using a correlation technique and a filtering technique based on a dynamic data received from a plurality of battery management system (BMS) sensors;

iteratively revising the battery parameters based on the SOC-SOH coupled estimation technique, wherein the battery parameters are iteratively revised for each cycle based on iteratively coupling the estimated revised SOC and the estimated revised SOH; and estimating and displaying a remaining useful life (RUL) for the lithium based batteries using the revised SOC and the revised SOH.

* * * * *